(12) United States Patent
Lee et al.

(10) Patent No.: US 11,135,779 B2
(45) Date of Patent: Oct. 5, 2021

(54) ULTRASONIC BONDING APPARATUS AND ULTRASONIC BONDING METHOD USING THE SAME

(71) Applicant: Samsung Display Co., Ltd., Yongin-Si (KR)

(72) Inventors: Hyun a Lee, Seoul (KR); Chan-Jae Park, Suwon-si (KR); Heeju Woo, Tongyeong-si (KR); Kikyung Youk, Bucheon-si (KR); Sangduk Lee, Yongin-si (KR); Daehwan Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/886,993

(22) Filed: May 29, 2020

(65) Prior Publication Data

US 2021/0094238 A1   Apr. 1, 2021

(30) Foreign Application Priority Data

Sep. 30, 2019   (KR) .................. 10-2019-0120708

(51) Int. Cl.
   *B29C 65/00*   (2006.01)
   *B29C 65/08*   (2006.01)
   *H05K 3/30*   (2006.01)

(52) U.S. Cl.
   CPC ............. *B29C 65/08* (2013.01); *H05K 3/303* (2013.01); *B29C 65/081* (2013.01); *B29C 65/088* (2013.01)

(58) Field of Classification Search
   CPC ...... B29C 65/08; B29C 65/081; B29C 65/088
   See application file for complete search history.

(56) References Cited

U.S. PATENT DOCUMENTS

| | | | |
|---|---|---|---|
| 6,491,785 B1 * | 12/2002 | Sato | B23K 20/10 156/379.6 |
| 7,424,966 B2 | 9/2008 | Kainuma et al. | |
| 2003/0019561 A1 * | 1/2003 | Tominaga | H01L 24/81 156/73.1 |
| 2018/0114768 A1 | 4/2018 | Song et al. | |

FOREIGN PATENT DOCUMENTS

| | | |
|---|---|---|
| JP | 2006135249 A | 5/2006 |
| JP | 2017064779 A | 4/2017 |
| KR | 100950980 B1 | 4/2010 |
| KR | 1020180043872 A | 5/2018 |

\* cited by examiner

*Primary Examiner* — Mark A Osele
*Assistant Examiner* — Nickolas R Harm
(74) *Attorney, Agent, or Firm* — Cantor Colburn LLP

(57) ABSTRACT

An ultrasonic bonding apparatus includes a stage on which a display panel is seated, a first ultrasonic generation unit which is connected to the stage and vibrates in a first direction and provide a first polarization, and a second ultrasonic generation unit in which an electronic component is seated and which vibrates in a second direction that is crossed with the first direction, and provides a second polarization, where a third polarization is provided on a plane on which the display panel contacts the electronic component.

20 Claims, 10 Drawing Sheets

ULTRASONIC BONDING APPARATUS AND ULTRASONIC BONDING METHOD USING THE SAME

This application claims priority to Korean Patent Application No. 10-2019-0120708, filed on Sep. 30, 2019, and all the benefits accruing therefrom under 35 U.S.C. § 119, the content of which in its entirety is herein incorporated by reference.

BACKGROUND

1. Field

Some embodiments of the invention herein relate to an ultrasonic bonding apparatus which has an enhanced reliability, and an ultrasonic bonding method using the same.

2. Description of the Related Art

A display device used in various electronic apparatuses such as a smartphone, a television, a monitor, or the like includes various elements such as a display panel, a touch sensor, and an electronic component.

The electronic component may be bonded to the display panel using an anisotropic conductive film or an ultrasonography. Among the anisotropic conductive film and the ultrasonography, the ultrasonography is a method for causing respective terminals of the display panel and the electronic component to contact and be bonded with each other through an ultrasonic vibration.

SUMMARY

Some embodiments of the invention provide an ultrasonic bonding apparatus which has an enhanced reliability, and an ultrasonic bonding method using the same.

Some embodiment of the invention provides an ultrasonic bonding apparatus including a stage on which a display panel is seated, a first ultrasonic generation unit connected to the stage and vibrates in a first direction and provides a first polarization, and a second ultrasonic generation unit in which an electronic component is seated and which vibrates in a second direction that is crossed with the first direction, and provides a second polarization, where a third polarization is provided on a plane on which the display panel contacts the electronic component.

In some embodiment, the ultrasonic bonding apparatus may further include a pressurization unit disposed over the second ultrasonic generation unit.

In some embodiment, the third polarization may be a synthesis wave of the first polarization and the second polarization.

In some embodiment, the third polarization may have a frequency about 40 kilohertz (kHz) to about 60 kHz.

In some embodiment, the first polarization and the second polarization may have a prescribed phase difference.

In some embodiment, the third polarization may be a circular polarization.

In some embodiment, the third polarization may be an elliptical polarization.

In some embodiment, the first polarization and the second polarization may have an identical phase.

In some embodiment, the third polarization may be a linear polarization.

In some embodiment, the first polarization and the second polarization may have an identical amplitude.

In some embodiment, the first ultrasonic generation unit and the second ultrasonic generation unit may vibrate at a substantially same time.

In some embodiment of the invention, an ultrasonic bonding method includes bringing a display panel, which is seated on a stage connected to a first ultrasonic generation unit, into contact with an electronic component seated in a second ultrasonic generation unit, providing a first polarization vibrating in a first direction from the first ultrasonic generation unit, providing a second polarization vibrating in a second direction, which crosses with the first direction, from the second ultrasonic generation unit, and joining the display panel to the electronic component by a third polarization provided on a plane on which the display panel contacts the electronic component.

In some embodiment, the third polarization may be a synthesis wave of the first polarization and the second polarization.

In some embodiment, the ultrasonic bonding method may further include applying, by a pressurization unit disposed over the second ultrasonic generation unit, pressure in a third direction that crosses with the first direction and the second direction.

In some embodiment, the providing the first polarization and the providing the second polarization may proceed at a substantially same time.

In some embodiment, the display panel may include a plurality of signal pads, the electronic component may include a plurality of driving bumps, and identical energy may be applied to each of planes on which the plurality signal pads contacts the plurality of driving bumps.

In some embodiment, the third polarization may have a frequency of about 40 kHz to about 60 kHz.

In some embodiment, the third polarization may be an elliptical polarization.

In some embodiment, the third polarization may be a linear polarization.

In some embodiment, the third polarization may be a circular polarization.

BRIEF DESCRIPTION OF THE DRAWINGS

The accompanying drawings are included to provide a further understanding of the invention, and are incorporated in and constitute a part of this specification. The drawings illustrate some embodiments of the invention and, together with the description, serve to explain principles of the invention. In the drawings.

DETAILED DESCRIPTION

Figure 1:
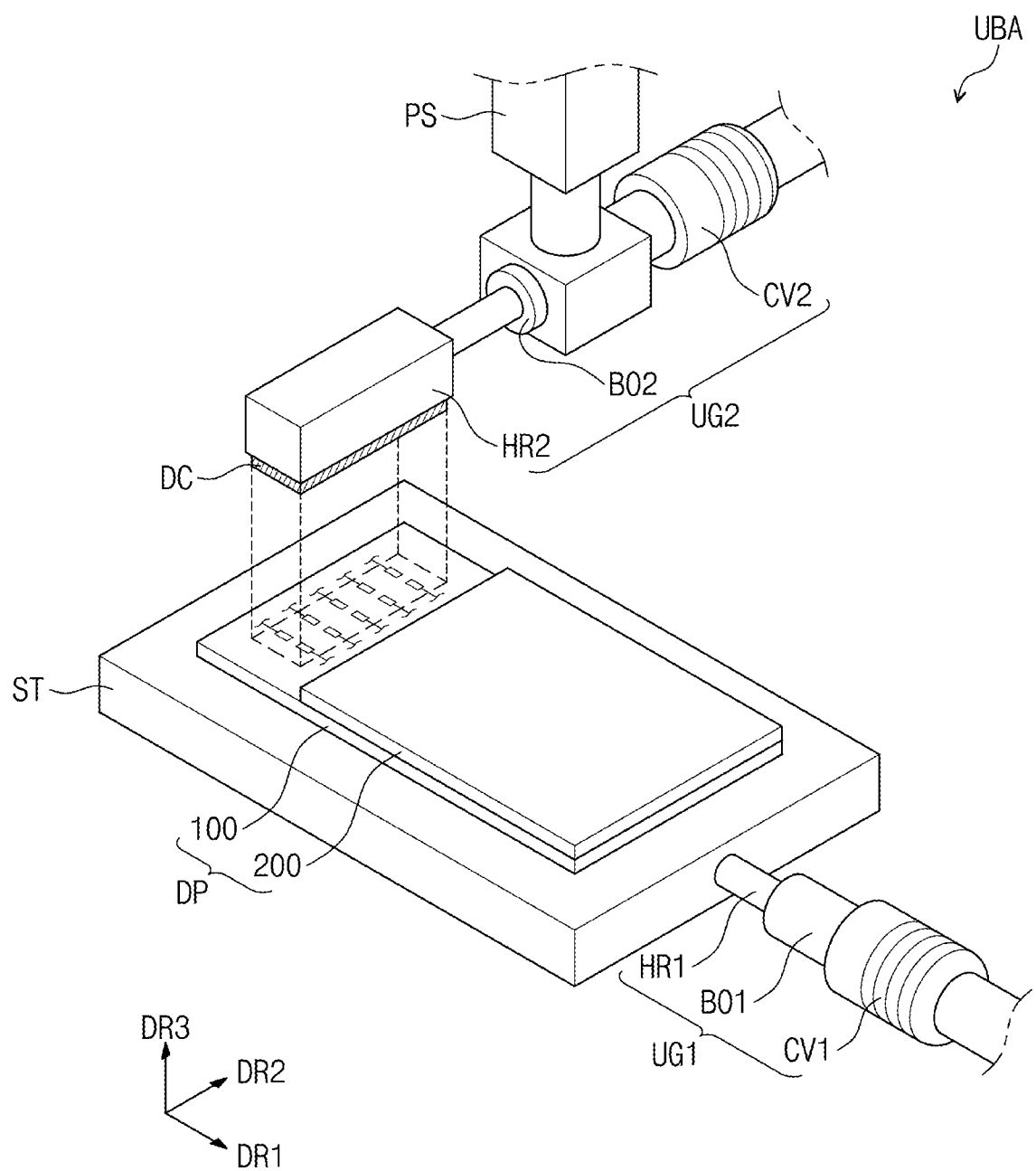
FIG. 1 is a perspective view illustrating some embodiment of an ultrasonic bonding apparatus according to the invention.

It will be understood that when an element or layer is referred to as being "on", "connected to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element are exaggerated for effective description of the technical contents.

The term "and/or" includes any and all combinations of one or more of the associated items.

Terms such as first, second, and the like may be used to describe various components, but these components should not be limited by the terms. These terms are generally only used to distinguish one element from another. For instance, a first component may be referred to as a second component, or similarly, a second component may be referred to as a first component, without departing from the scope of the invention. As used herein, the singular forms "a," "an," and "the" may be intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the drawing figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which some embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the invention will be described with reference to the accompanying drawings.

FIG. 1 is a perspective view illustrating some embodiment of an ultrasonic bonding apparatus according to the invention.

Referring to FIG. 1, an ultrasonic bonding apparatus UBA may include a stage ST, a first ultrasonic generation unit UG1, a second ultrasonic generation unit UG2, and a pressurization unit PS.

A display panel DP may be seated on the top surface of the stage ST. Some embodiment of the display panel DP according to the invention may be a light emissive display panel DP, but is not particularly limited thereto. In some embodiment, the display panel DP may be an organic light emitting display panel or a quantum dot light emitting display panel, for example. A light emitting layer of the organic light emitting display panel includes an organic light emitting material. A light emitting layer of the quantum dot light emitting display panel may include a quantum dot, a quantum rod, or the like.

The display panel DP may be parallel to a plane defined by a first direction DR1 and a second direction DR2 intersecting with the first direction DR1. A normal direction of the display panel DP may indicate a third direction DR3. The third direction DR3 may indicate a thickness direction of the display device. The third direction DR3 may be a direction crossing with the first direction DR1 and the second direction DR2. The first direction DR1, the second direction DR2, and the third direction DR3 may be perpendicular to each other.

Directions indicated by the first to third directions DR1, DR2, and DR3 are relative concepts and may be changed to other directions. In addition, in the specification, the surface defined by the first direction DR1 and the second direction DR2 is defined as a plane, and "being viewed in a plan view" may be defined as being viewed from the third direction DR3.

The display panel DP may include a first display substrate 100 (or a lower substrate) and a second display substrate 200 (or an upper substrate) disposed over the first display substrate 100. The first display substrate 100 may be brought into vacuum suction contact with the stage ST.

The first ultrasonic generation unit UG1 may be connected to the stage ST. The first ultrasonic generation unit UG1 may vibrate in the first direction DR1. The first ultrasonic generation unit UG1 may include a first converter CV1, a first booster BO1, and a first horn HR1.

The first converter CV1 may be connected to a power supplier for providing an electric signal. The first converter CV1 may convert the electric signal into a physical vibration. In some embodiment, the first converter CV1 may include a nickel vibrator, a ferrite vibrator, or a bolt-clamped Langevin type ("BLT") vibrator using a piezoelectric ceramic, for example. However, the above-described features are exemplary, and the first converter CV1 according to the invention is not limited thereto.

The first booster BO1 may be connected to the first converter CV1. The first booster BO1 may amplify the vibration generated from the first converter CV1. In some embodiment, the first booster BO1 may amplify the amplitude, for example.

The first horn HR1 may be connected to the first booster BO1. The first horn HR1 may deliver the vibration to the stage ST.

The second ultrasonic generation unit UG2 may be disposed over the stage ST. The second ultrasonic generation unit UG2 may vibrate in the second direction DR2. The second ultrasonic generation unit UG2 may include a second converter CV2, a second booster BO2, and a second horn HR2.

The second converter CV2 may perform substantially the same functions as those of the first converter CV1. The second booster BO2 may perform substantially the same functions as those of the first booster BO1. The second horn HR2 may be connected to the second booster BO2. An electronic component DC may be seated in the second horn HR2. The electronic component DC may be brought into vacuum suction contact with the second horn HR2. The second horn HR2 may deliver a vibration to the electronic component DC.

The electronic component DC may include a driving chip for delivering a driving signal to the display panel DP. In some embodiment, the electronic component DC may generate the driving signal desired for an operation of the display panel DP on the basis of a control signal delivered from the outside, for example.

The pressurization unit PS may be disposed over the second ultrasonic generation unit UG2. The pressurization unit PS may apply pressure in the third direction DR3. In some embodiment, the pressurization unit PS may include a cylinder moving in the third direction DR3, for example. However, the above-described features are exemplary, and the pressurization unit PS according to the invention is not limited thereto.

Figure 2:
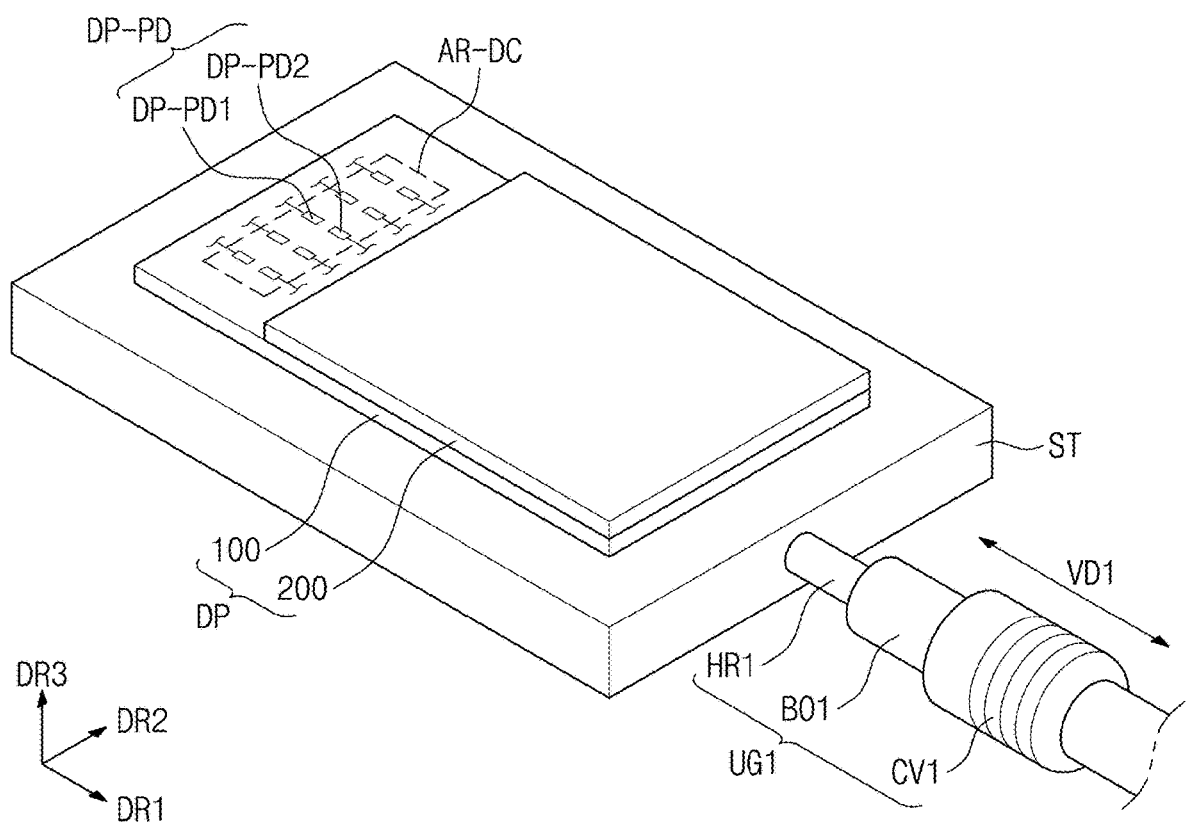
FIG. 2 is a perspective view illustrating some embodiment of a portion of an ultrasonic bonding apparatus according to the invention.

FIG. 2 is a perspective view illustrating some embodiment of a portion of an ultrasonic bonding apparatus according to the invention. Like reference numerals are given to the elements described with reference to FIG. 1, and descriptions thereabout will be omitted.

Referring to FIG. 2, the first ultrasonic generation unit UG1 may provide a first vibration VD1. The first vibration VD1 may vibrate in a direction parallel to the first direction DR1. The first vibration VD1 may be delivered to the stage ST. The first vibration VD1 delivered to the stage ST may be delivered to the display panel DP.

A chip area AR-DC may be defined in the first display substrate 100. Signal pads DP-PD may be disposed in the chip area AR-DC. The signal pads DP-PD may be electrically connected to the electronic component DC (refer to FIG. 1) to deliver an electrical signal received from the electronic component DC (refer to FIG. 1) to the display panel DP.

The signal pads DP-PD may include first signal pads DP-PD1 arranged in a first row along the second direction DR2 and second signal pads DP-PD2 arranged in a second row along the second direction DR2, which are separated from the first row in the first direction DR1. However, the above-described is merely exemplary. The signal pads DP-PD according to the invention are not limited thereto, and may be arranged in one row along the second direction DR2.

The first vibration VD1 may be delivered to the signal pads DP-PD and vibrate the signal pads DP-PD.

Figure 3:
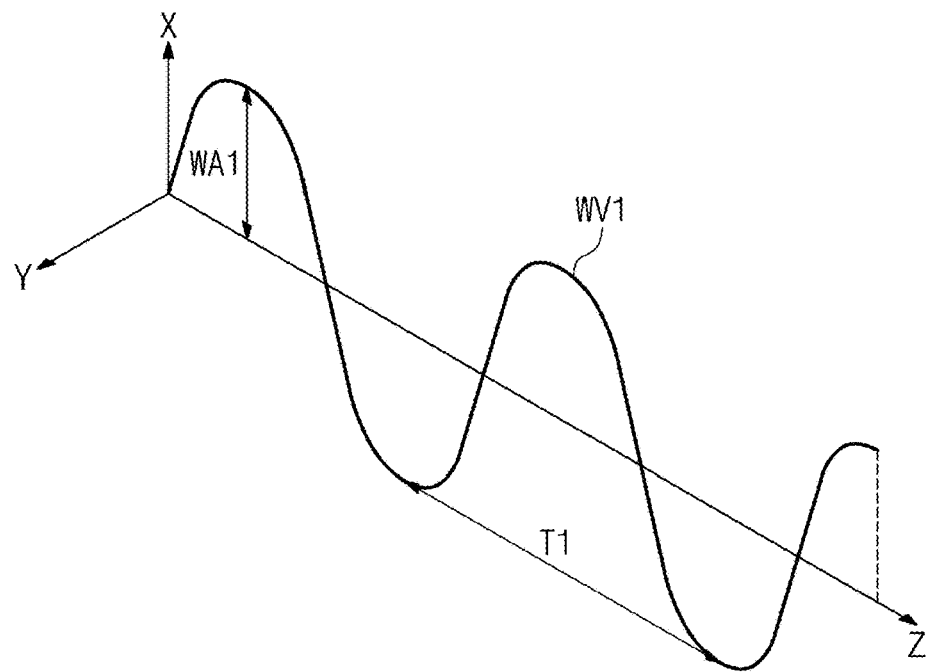
FIG. 3 is a graph illustrating some embodiment of a first polarization according to the invention.

FIG. 3 is a graph illustrating some embodiment of a first polarization according to the invention.

Referring to FIGS. 2 and 3, the first polarization WV1 may be provided by the first vibration VD1. An X-axis and a Y-axis may denote displacement axes. A Z-axis may denote a time axis. The amplitude WA1 of the first polarization WV1 may be the amplitude amplified by the first booster BO1. The reciprocal of a first period T1 may denote a first frequency of an ultrasonic wave generated in the first ultrasonic generation unit UG1. In some embodiment, the first frequency may be about 40 kilohertz (kHz) to about 60 kHz, for example. The first polarization WV1 may be a linear polarization. In some embodiment, the first polarization may be a vertical polarization, for example. However, the above-described features are exemplary, and the first polarization WV1 according to the invention is not limited thereto.

Figure 4:
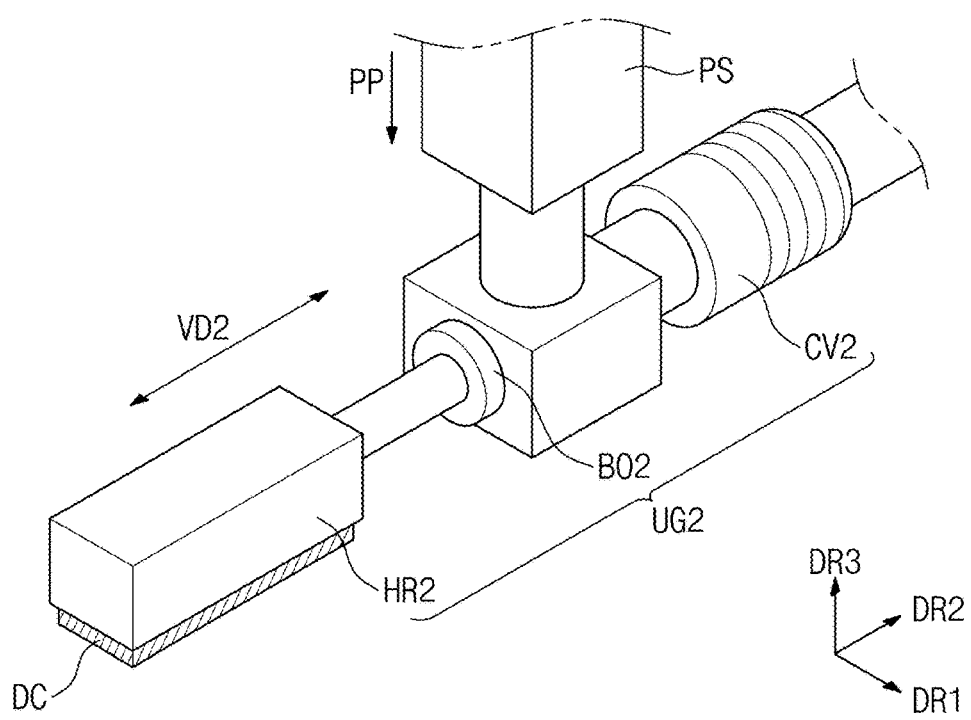
FIG. 4 is a perspective view illustrating some embodiment of a portion of an ultrasonic bonding apparatus according to the invention.
Figure 5:
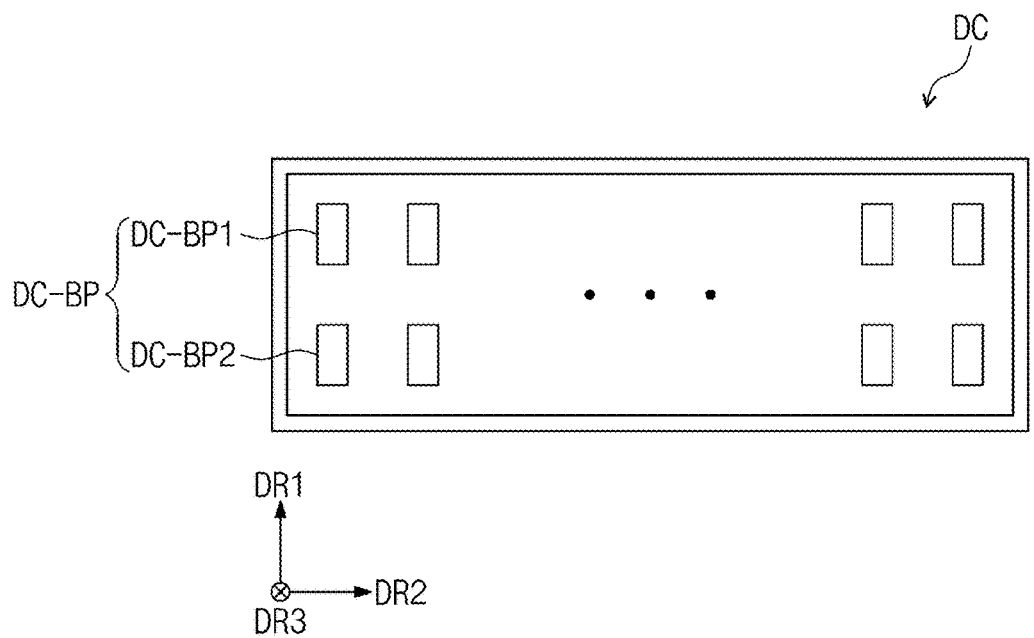
FIG. 5 is a plan view of some embodiment of an electronic component according to the invention.

FIG. 4 is a perspective view illustrating some embodiment of a portion of an ultrasonic bonding apparatus according to the invention, and FIG. 5 is a plan view illustrating some embodiment of an electronic component according to the invention. Like reference numerals are given to the elements described with reference to FIG. 1, and descriptions thereabout will be omitted.

Referring to FIGS. 4 and 5, the second ultrasonic generation unit UG2 may provide a second vibration VD2. The second vibration VD2 may vibrate in a direction parallel to the second direction DR2. The second vibration VD2 may be delivered to the electronic component DC.

The electronic component DC may include driving bumps DC-BP respectively corresponding to the signal pads DP-PD (refer to FIG. 2). The driving bumps DC-BP may include first driving bumps DC-BP1 arranged in a first row along the second direction DR2 and second driving bumps DC-BP2 arranged in a second row separated from the first row in the first direction DR1. However, the above-described features are exemplary. The driving bumps DC-BP according to the invention are not limited thereto, and may be arranged in one row along the second direction DR2.

In some embodiment of the invention, each of the first driving bumps DC-BP1 and the first signal pads DP-PD1 (refer to FIG. 2) may overlap each other on a plane. The second driving bumps DC-BP2 and the second signal pads DP-PD2 (refer to FIG. 2) may overlap each other on a plane. The electronic component DC may include circuit elements for providing electric signals to the first driving bumps DC-BP1 and the second driving bumps DC-BP2.

The pressurization unit PS may apply pressure PP to the second ultrasonic generation unit UG2. The pressure PP may be provided in a third direction DR3 so that the signal pads DP-PD (refer to FIG. 2) and the driving bumps DC-BP contact each other.

Figure 6:
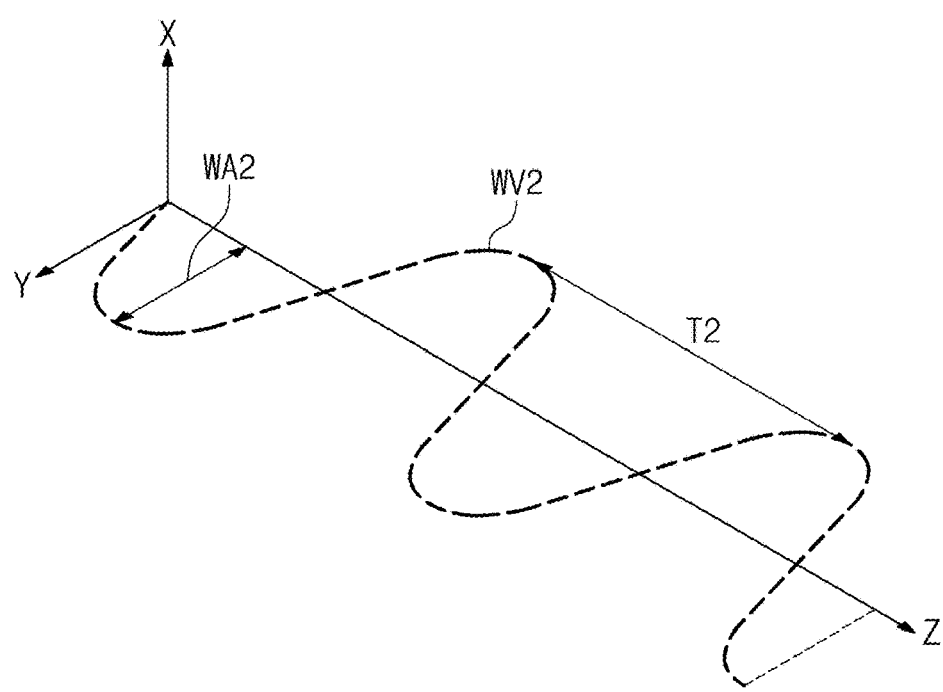
FIG. 6 is a graph illustrating some embodiment of a second polarization according to the invention.

FIG. 6 is a graph illustrating some embodiment of a second polarization according to the invention.

Referring to FIGS. 4 to 6, the second polarization WV2 may be provided by the second vibration VD2. An X-axis and a Y-axis may denote displacement axes. A Z-axis may denote a time axis. The amplitude WA2 of the second polarization WV2 may be amplified by the second booster BO2. The reciprocal of the second period T2 may represent a second frequency of an ultrasonic wave generated by the second ultrasonic generation unit UG2. In some embodiment, the second frequency may be about 40 kHz to about 60 kHz, for example. The second polarization may be a linear polarization. In some embodiment, the second polarization may be a horizontal polarization, for example. However, this is exemplary, and the second polarization according to the invention is not limited thereto.

Figure 7:
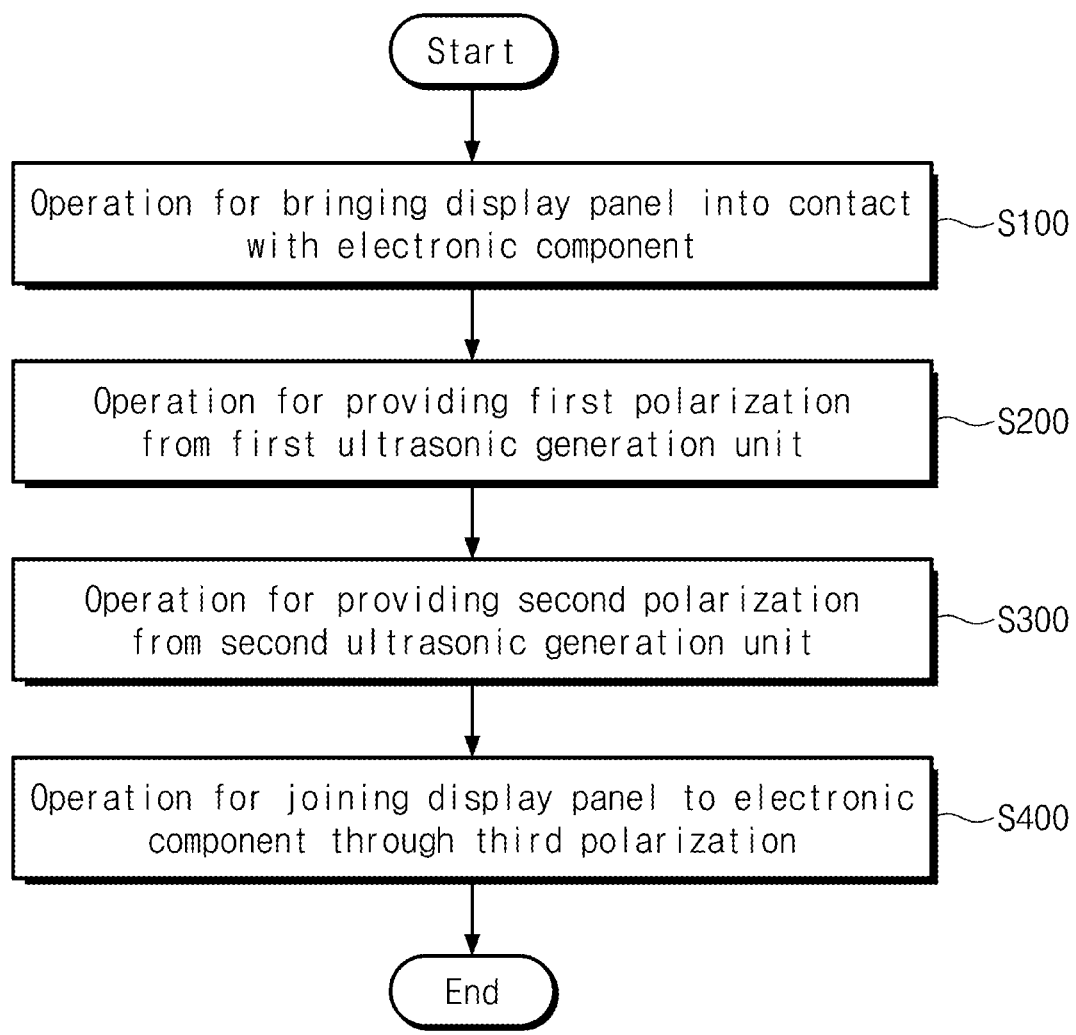
FIG. 7 is a flowchart illustrating some embodiment of an ultrasonic bonding method according to the invention.
Figure 8:
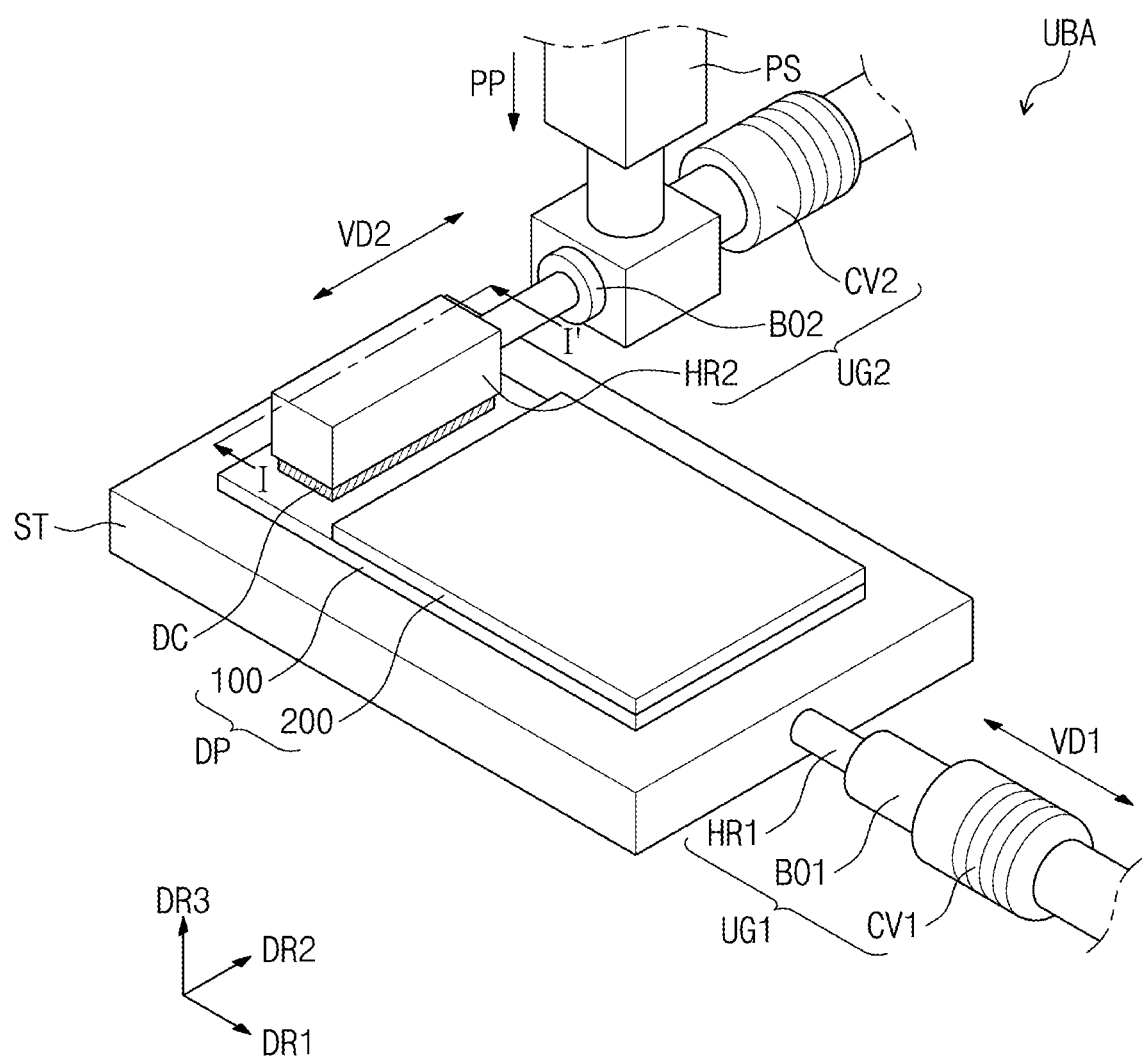
FIG. 8 is a perspective view illustrating some embodiment of an ultrasonic bonding apparatus according to the invention.

FIG. 7 is a flowchart showing some embodiment of an ultrasonic bonding method according to the invention, and FIG. 8 is a perspective view of some embodiment of an ultrasonic bonding apparatus according to the invention. Like reference numerals are given to the elements described with reference to FIG. 1, and descriptions thereabout will be omitted.

Referring to FIGS. 7 and 8, in the ultrasonic bonding method using the ultrasonic bonding apparatus, the display panel DP and the electronic component DC may contact each other (operation S100). In some embodiment, the electronic component DC seated in the second ultrasonic generation unit UG2 may receive the pressure PP in the third direction DR3 from the pressurization unit PS to contact the display panel DP, for example. The signal pads DP-PD (refer to FIG. 2) of the display panel DP may respectively contact the driving bumps DC-BP (refer to FIG. 5) to be electrically connected to each other.

The first ultrasonic generation unit UG1 may provide the first vibration VD1 vibrating in a direction parallel to the first direction DR1. The first polarization WV1 (refer to FIG. 3) may be provided by the first vibration VD1 from the first ultrasonic generation unit UG1 (operation S200). The first polarization WV1 (refer to FIG. 3) may be provided to the display panel DP to which the first vibration VD1 is delivered.

The second ultrasonic generation unit UG2 may provide the second vibration VD2 vibrating in a direction parallel to the second direction DR2. The second polarization WV2 (refer to FIG. 6) may be provided by the second vibration VD2 from the second ultrasonic generation unit UG2 (operation S300). The second polarization WV2 (refer to FIG. 6) may be provided to the electronic component DC to which the second vibration VD2 is delivered.

The first ultrasonic generation unit UG1 and the second ultrasonic generation unit UG2 may vibrate at the substantially same time.

A third polarization WV3 (refer to FIG. 11B) may be provided on a plane on which the display panel DP contacts the electronic component DC. The third polarization WV3 (refer to FIG. 11B) may be a synthesis wave in which the first polarization WV1 (refer to FIG. 3) and the second polarization WV2 (refer to FIG. 6) are synthesized. The display panel DP and the electronic component DC may be joined by the third polarization WV3 (refer to FIG. 11B) (operation S400).

Figure 9:
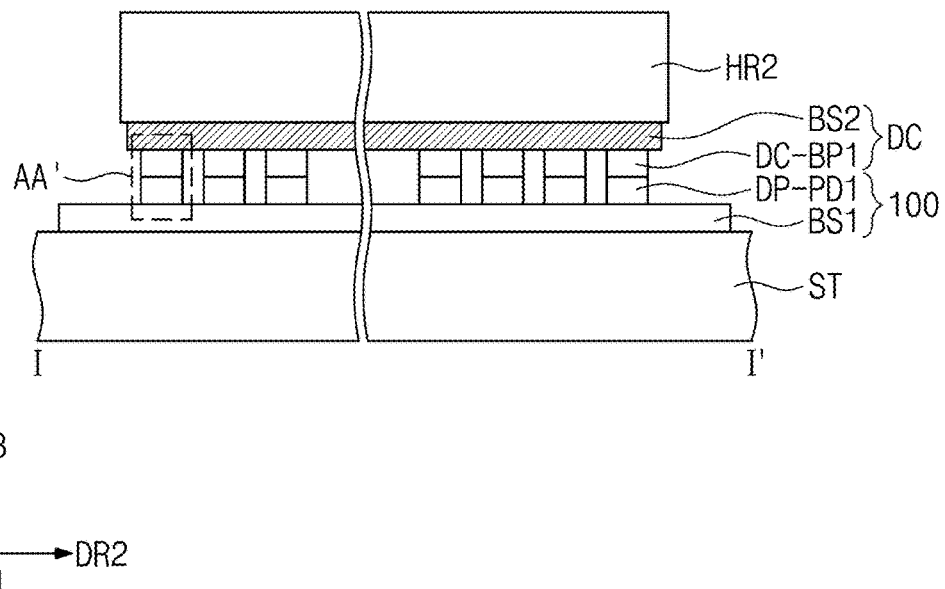
FIG. 9 is a cross-sectional view cut along I-I' of some embodiment of FIG. 8 according to the invention.

FIG. 9 is a cross-sectional view cut along I-I' of some embodiment of FIG. 8 according to the invention.

Referring to FIGS. 8 and 9, the first display substrate 100 may be disposed over the stage ST. The first display substrate 100 may include a first base layer BS1 and the first signal pads DP-PD1. The first polarization WV1 (refer to FIG. 3) may be provided in each of the first signal pads DP-PD1 by the first vibration VD1 from the first ultrasonic generation unit UG1.

The second horn HR2 may be disposed over the stage ST. The electronic component DC may be disposed under the second horn HR2. The electronic component DC may include a second base layer BS2 and the first driving bumps DC-BP1. The second polarization WV2 (refer to FIG. 6) may be provided in each of the first driving bumps DC-BP1 by the second vibration VD2 from the second ultrasonic generation unit UG2.

The third polarization WV3 (refer to FIG. 11B) may be provided on each of the surfaces on which the first signal pads DP-PD1 and the first driving bumps DC-BP1 contact each other. The third polarization WV3 (refer to FIG. 11B) may be a synthesis wave in which the first polarization WV1 (refer to FIG. 3) and the second polarization WV2 (refer to FIG. 6) are synthesized.

According to the invention, by the third polarization WV3 (refer to FIG. 11B), the same energy may be applied to each of the surfaces on which the first signal pads DP-PD1 and the first driving bumps DC-BP1 contact each other. Accordingly, when the first signal pads DP-PD1 and the first driving bumps DC-BP1 are respectively joined to each other, it may be prevented that difference energies are applied to cause twisted junctions. Accordingly, an ultrasonic bonding apparatus which has the enhanced reliability, and an ultrasonic bonding method using the same may be provided.

The energy may be proportional to the multiplication of the amplitude of the third polarization WV3 (refer to FIG. 11B), the frequency of the third polarization WV3 (refer to FIG. 11B), and a junction time between the first signal pads DP-PD1 and the first driving bumps DC-BP1. The pressure PP may be controlled by the pressurization unit PS. The amplitude of the third polarization WV3 (refer to FIG. 11B) may be controlled by the amplitude of the first polarization WV1 (refer to FIG. 3), which is amplified by the first booster BO1 and the amplitude of the second polarization WV2 (refer to FIG. 6), which is amplified by the second booster BO2. The frequency of the third polarization WV3 (refer to FIG. 11B) may have a frequency of an ultrasonic wave. In some embodiment, the frequency may be about 40 kHz to about 60 kHz, for example.

According to the invention, in the ultrasonic bonding apparatus UBA, the first signal pads DP-PD1 and the first driving bumps DC-BP1 may be joined by the third polarization WV3 (refer to FIG. 11B) in which the first polarization WV1 (refer to FIG. 3) and the second polarization WV2 (refer to FIG. 6) are synthesized. The third polarization WV3 (refer to FIG. 11B) may be provided through a composite vibration. Since the junction through the composite vibration desires a smaller amplitude and a smaller pressure than a junction through a linear vibration, the junction through the composite vibration may desire less energy than the junction through the linear vibration does. Accordingly, a damage, which may occur when the first signal pads DP-PD1 and the first driving bumps DC-BP1 are joined, and the influence of temperature may be minimized. Therefore, the ultrasonic bonding apparatus UBA which has the enhanced reliability, and the ultrasonic bonding method using the same may be provided.

Figure 10:
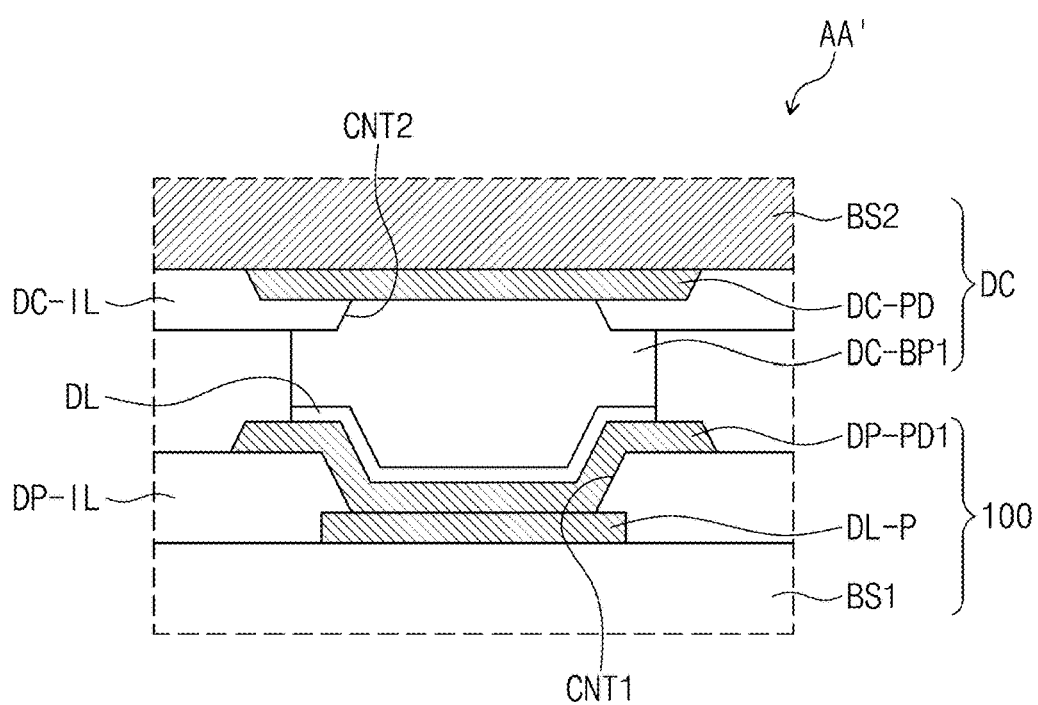
FIG. 10 is a cross-sectional view of an enlarged portion of AA' area of some embodiment of FIG. 9 according to the invention.

FIG. 10 is a cross-sectional view of some embodiment of an enlarged part of AA' area of FIG. 9 according to the invention. Like reference numerals are given to the elements described with reference to FIG. 9, and descriptions thereabout will be omitted.

Referring to FIG. 10, a first display substrate 100 may include a first base layer BS1, a pad unit DL-P, an insulation layer DP-IL, and a first signal pad DP-PD1.

The pad unit DL-P may be disposed over the first base layer BS1. The pad unit DL-P may be electrically connected to a circuit element of the display panel DP (refer to FIG. 8). A first contact hole CNT1, which exposes the pad unit DL-P, may be defined in the insulation layer DP-IL disposed over the first base layer BS1. The first signal pad DP-PD1 may be disposed over the insulation layer DP-IL in contact with the pad unit DL-P through the first contact hole CNT1.

The electronic component DC may include a second base layer BS2, a driving insulation layer DC-IL, a driving pad unit DC-PD, and a first driving bump DC-BP1.

The driving pad unit DC-PD may be disposed under the second base layer BS2. The driving pad unit DC-PD may be electrically connected to a circuit element of the electronic component DC. A second contact hole CNT2, which exposes the driving pad unit DC-PD, may be defined in the driving insulation layer DC-IL disposed over the second base layer BS2. The first driving bump DC-BP1 may be disposed over the driving insulation layer DC-IL in contact with the driving pad unit DC-PD through the second contact hole CNT2.

The first signal pad DP-PD1 and the first driving bump DC-Bp1 may be joined by the ultrasonic bonding apparatus UBA (refer to FIG. 8). A conductive junction layer DL may be provided between the first signal pad DP-PD1 and the first driving bump DC-BP1. In some embodiment, a vibration having a frequency in an ultrasonic range is applied by the ultrasonic bonding apparatus UBA (refer to FIG. 8) to make friction rapidly between the first signal pad DP-PD1 and the first driving bump DC-BP1, for example. Accordingly, the friction energy may be generated between the first signal pad DP-PD1 and the first driving bump DC-BP1. Each surface of the first signal pad DP-PD1 and the first driving bump DC-BP1 may be melted by the friction energy. A diffusion layer may be provided between the melted first signal pad DP-PD1 and first driving bump DC-BP1, and a first metal included in the first signal pad DP-PD1 may be mixed with a second metal included in the first driving bump DC-BP1 to provide the conductive junction layer DL. The first metal and the second metal may be mixed and embedded in the conductive junction layer DL.

When the electronic component DC is disposed (e.g., mounted) on the display panel DP using an adhesive such as an anisotropic conductive film ("ACF"), it is probable to cause an occurrence of a short-circuit defect or an open-circuit failure. In some embodiment, a conductive particle included in the ACF may be concentrated in both sides of the first driving bump DC-BP1 to cause a short-circuit defect between adjacent driving bumps, or conductive particles in the ACF may not be suitably disposed at a position corresponding to the first driving bump DC-BP1 to cause an open-circuit failure, for example. Some embodiment of the ultrasonic bonding apparatus UBA (refer to FIG. 8) according to the invention may cause the electronic component DC to be disposed (e.g., mounted) on the display panel DP using an ultrasonography. Accordingly, the third polarization WV3 (refer to FIG. 11B) may be provided on a plane on which the first signal pad DP-PD1 contacts the first driving bump DC-BP1. Energy may be applied through the third polarization WV3 (refer to FIG. 11B) to the plane on which the first signal pad DP-PD1 contacts the first driving bump DC-BP1, and thus the conductive junction layer DL may be provided. Since the first metal is directly combined with the second metal in the conductive junction layer DL, the conductivity may be higher than that of a combination using an adhesive. In addition, processes therefor may be reduced and accordingly, a tack time may be shortened.

Figure 11A:
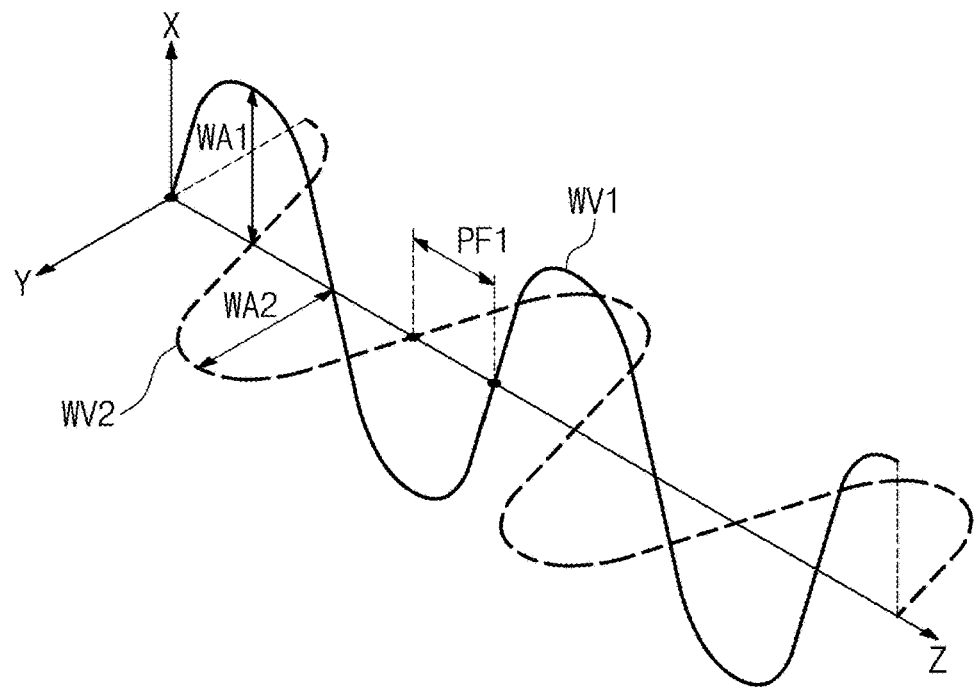
FIG. 11A is a graph illustrating some embodiment of a first polarization and a second polarization according to the invention.
Figure 11B:
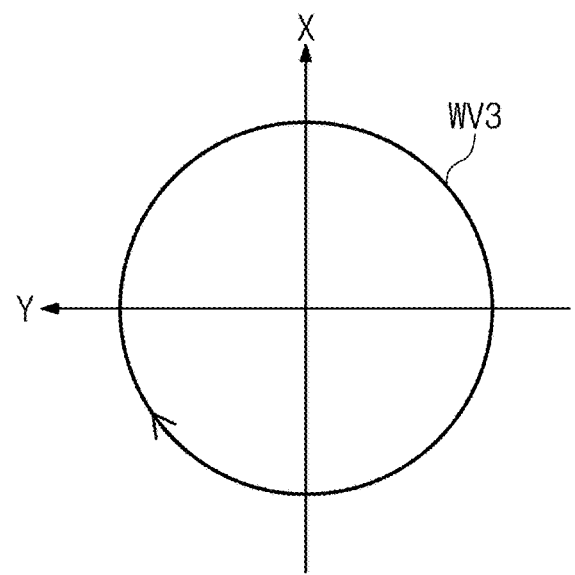
FIG. 11B is a graph illustrating some embodiment of a third polarization according to the invention.

FIG. 11A is a graph illustrating some embodiment of the first polarization and the second polarization according to the invention, and FIG. 11B is a graph illustrating some embodiment of the third polarization according to the invention.

FIGS. 11A and 11B, the first polarization WV1 may be a vibration wave that the signal pads DP-PD (refer to FIG. 2) have. The second polarization WV2 may be a vibration wave that the driving bumps DC-BP (refer to FIG. 5) have. An X-axis and a Y-axis may denote displacement axes. An X-axis and a Y-axis may denote displacement axes. A Z-axis may denote a time axis. The first polarization WV1 and the second polarization WV2 may be provided on the plane on which the signal pads DP-PD (refer to FIG. 2) contact the driving bumps DC-BP (refer to FIG. 5). The magnitude of the amplitude WA1 of the first polarization WV1 and the magnitude of the amplitude WA2 of the second polarization WV2 may be the same. A phase difference PF1 between the first polarization WV1 and the second polarization WV2 may be about $\pm\pi/2$ to about $\pm 2n\pi$, where n may be an integer. In some embodiment, the phase difference PF1 between the first polarization WV1 and the second polarization WV2 may be about 90 degrees (°), for example. The first polarization WV1 may be perpendicular to the second polarization WV2.

The first polarization WV1 and the second polarization WV2 may be synthesized on the plane on which the signal pads DP-PD (refer to FIG. 2) contact the driving bumps DC-BP. The third polarization WV3 may be a synthesis wave in which the first polarization WV1 is synthesized with the second polarization WV2. The third polarization WV3 may be a circular polarization. In some embodiment, the third polarization WV3 may be a left-handed circular polarization ("LHCP"), for example. However, this is merely exemplary, and the third polarization WV3 according to the invention may be a right-handed circular polarization ("RHCP").

According to the invention, the third polarization WV3 may be a circular polarization. The third polarization WV3 may deliver energy to the plane on which the signal pads DP-PD (refer to FIG. 2) contact the driving bumps DC-BP (refer to FIG. 5). The third polarization WV3 may join the signal pads DP-PD (refer to FIG. 2) to the driving bumps DC-BP (refer to FIG. 5) with lower energy than a linear polarization does, and may minimize a damage that may occur when the signal pads DP-PD (refer to FIG. 2) are joined to the driving bumps DC-BP (refer to FIG. 5), or the influence of temperature. Accordingly, the ultrasonic bonding apparatus UBA (refer to FIG. 8) which has the enhanced reliability, and the ultrasonic bonding method using the same may be provided.

Figure 12A:
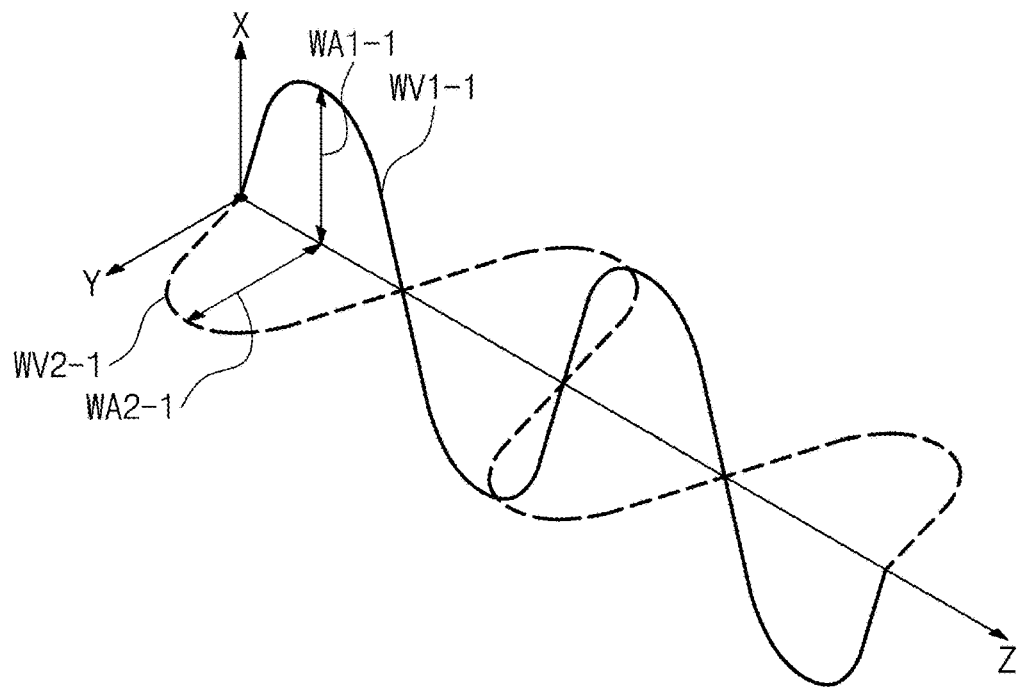
FIG. 12A is a graph illustrating some embodiment of a first polarization and a second polarization according to the invention.
Figure 12B:
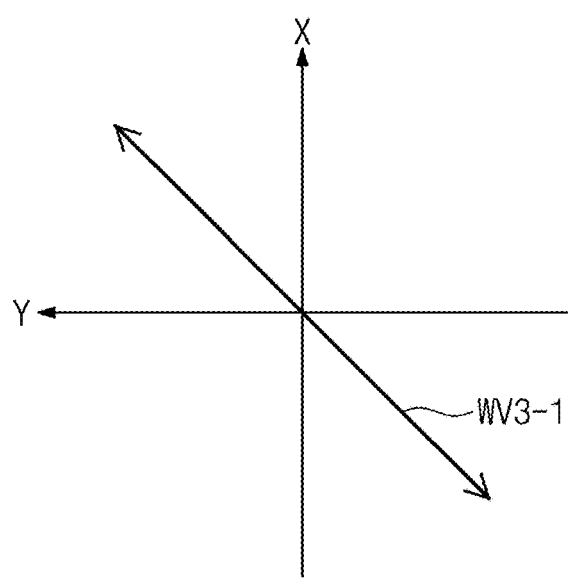
FIG. 12B is a graph illustrating some embodiment of a third polarization according to the invention.

FIG. 12A is a graph illustrating some embodiment of a first polarization and a second polarization according to the invention, and FIG. 12B is a graph illustrating some embodiment of a third polarization according to the invention.

Referring to FIGS. 12A and 12B, the first polarization WV1-1 may be a vibration wave that the signal pads DP-PD (refer to FIG. 2) have. The second polarization WV2-1 may be a vibration wave that the driving bumps DC-BP (refer to FIG. 5) have. An X-axis and a Y-axis may denote displacement axes. A Z-axis may denote a time axis. The first polarization WV1-1 and the second polarization WV2-1 may be provided on the plane on which the signal pads DP-PD (refer to FIG. 2) contacts the driving bumps DC-BP (refer to FIG. 5). The magnitude of the amplitude WA1-1 of the first polarization WV1-1 and the magnitude of the amplitude WA2-1 of the second polarization WV2-1 may be the same. A phase difference between the first polarization WV1-1 and the second polarization WV2-1 may be about 0° or an integer multiple of about $\pm\pi$. The first polarization WV1-1 may be perpendicular to the second polarization WV2-1.

The first polarization WV1-1 and the second polarization WV2-1 may be synthesized on the plane on which the signal pads DP-PD (refer to FIG. 2) contact the driving bumps DC-BP. The third polarization WV3-1 may be a synthesis wave in which the first polarization WV1-1 is synthesized with the second polarization WV2-1. The third polarization WV3-1 may be a linear polarization.

According to the invention, the third polarization WV3-1 may be a linear polarization. The third polarization WV3-1 may deliver energy to the plane on which the signal pads DP-PD (refer to FIG. 2) contact the driving bumps DC-BP (refer to FIG. 5). The third polarization WV3-1 may join the signal pads DP-PD (refer to FIG. 2) to the driving bumps DC-BP (refer to FIG. 5) with higher energy than that each of the first polarization WV-1 or the second polarization WV-2 has, and may easily remove an oxide layer and contamination on the top surface of each of the signal pads DP-PD (refer to FIG. 2) and the driving bumps DC-BP (refer to FIG. 5). Accordingly, the ultrasonic bonding apparatus UBA (refer to FIG. 8) which has the enhanced reliability, and the ultrasonic bonding method using the same may be provided.

Figure 13A:
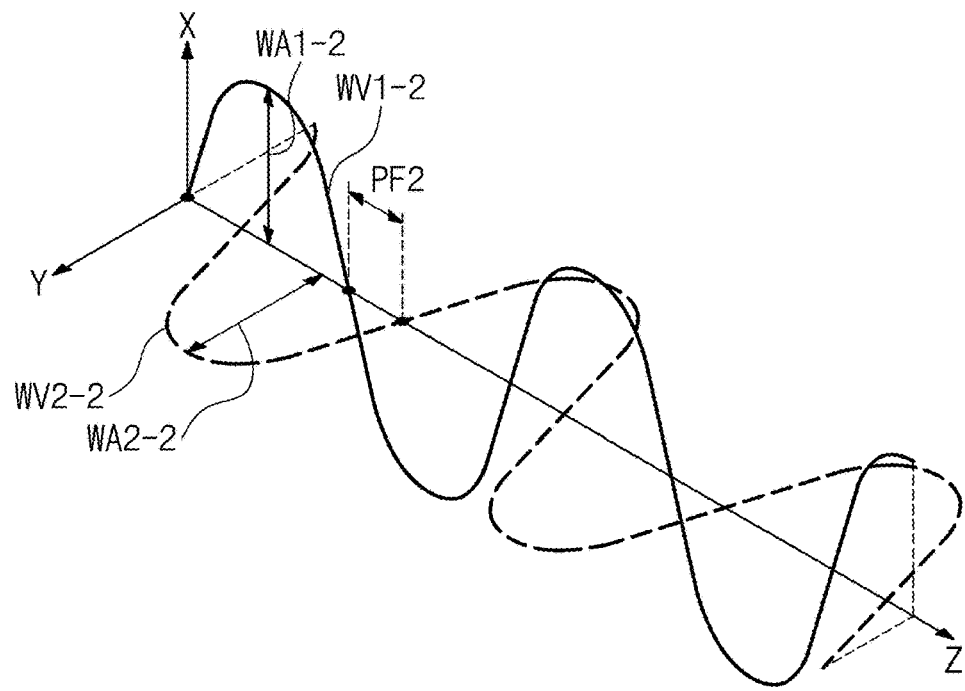
FIG. 13A is a graph illustrating some embodiment of a first polarization and a second polarization according to the invention.
Figure 13B:
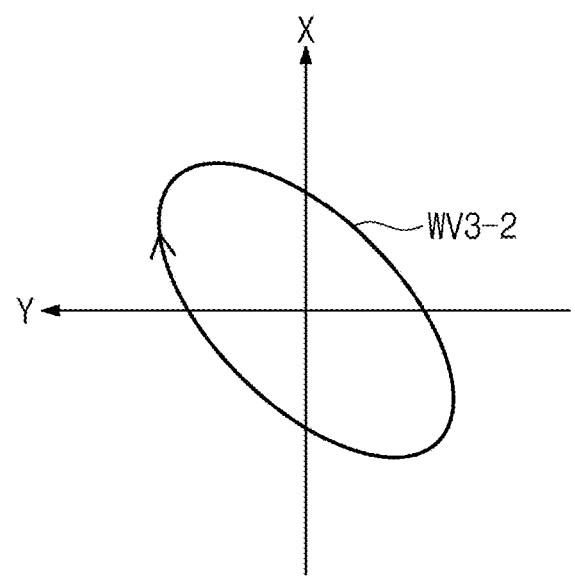
FIG. 13B is a graph illustrating some embodiment of a third polarization according to the invention.

FIG. 13A is a graph illustrating some embodiment of a first polarization and a second polarization according to the invention, and FIG. 13B is a graph illustrating some embodiment of a third polarization according to the invention.

Referring to FIGS. 13A and 13B, the first polarization WV1-2 may be a vibration wave that the signal pads DP-PD (refer to FIG. 2) have. The second polarization WV2-2 may be a vibration wave that the driving bumps DC-BP (refer to FIG. 5) have. An X-axis and a Y-axis may denote displacement axes. A Z-axis may denote a time axis. The first polarization WV1-2 and the second polarization WV2-2 may be provided on the plane on which the signal pads DP-PD (refer to FIG. 2) contact the driving bumps DC-BP (refer to FIG. 5). The magnitude of the amplitude WA1-2 of the first polarization WV1-2 and the magnitude of the amplitude WA2-2 of the second polarization WV2-2 may be the same. However, the above-described features are merely exemplary, and the magnitude of the amplitude WA1-2 of the first polarization WV1-2 and the magnitude of the amplitude WA2-2 of the second polarization WV2-2 according to the invention may be different. A phase difference PF2 between the first polarization WV1-2 and the second polarization WV2-2 may be a prescribed value. The first polarization WV1-2 may be perpendicular to the second polarization WV2-2.

The first polarization WV1-2 and the second polarization WV2-2 may be synthesized on the plane on which the signal pads DP-PD (refer to FIG. 2) contact the driving bumps DC-BP. The third polarization WV3-2 may be a synthesis wave in which the first polarization WV1-2 is synthesized with the second polarization WV2-2. The third polarization WV3-2 may be an elliptical polarization. In some embodiment, the third polarization WV3-2 may be a left-handed elliptical polarization ("LHEP"), for example. However, this is merely exemplary, and the third polarization WV3-2 according to the invention may be a right-handed elliptical polarization ("RHEP"). The third polarization WV3-2 may deliver energy to the plane on which the signal pads DP-PD (refer to FIG. 2) contact the driving bumps DC-BP (refer to FIG. 5). The ultrasonic bonding apparatus UBA (refer to FIG. 8) may control the amplitudes and/or the phases of the first polarization WV1 and the second polarization WV2 to provide a suitable elliptical polarization according to the plane on which the signal pads DP-PD (refer to FIG. 2) contact the driving bumps DC-BP (refer to FIG. 5).

According to the invention, the ultrasonic bonding apparatus may include the first ultrasonic generation unit for providing a first polarization to a display panel including a plurality of signal pads, and a second ultrasonic generation unit for providing a second polarization to an electronic component including a plurality of driving bumps. The first polarization and the second polarization may be synthesized and apply the same energy onto each of planes on which the plurality of signal pads contacts the plurality of driving bumps. Accordingly, when the plurality of signal pads and the plurality of driving bumps are respectively joined to each other, it may be prevented that difference energies are applied to cause twisted junctions. Therefore, an ultrasonic bonding apparatus which has the enhanced reliability, and an ultrasonic bonding method using the same may be provided.

While this invention has been described with reference to some embodiments thereof, it will be clear to those of ordinary skill in the art to which the invention pertains that various changes and modifications may be made to the described embodiments without departing from the spirit and technical area of the invention as defined in the appended claims and their equivalents. Thus, the scope of the invention shall not be restricted or limited by the foregoing description, but be determined by the broadest permissible interpretation of the following claims.

Although the some embodiments of the invention have been described, it is understood that the invention should not be limited to these some embodiments but various changes and modifications may be made by one ordinary skilled in the art within the spirit and scope of the invention as hereinafter claimed.

What is claimed is:

1. An ultrasonic bonding apparatus comprising:
    a stage on which a display panel is seated;
    a first ultrasonic generation unit which is connected to the stage and vibrates in a first direction and provides a first polarization; and
    a second ultrasonic generation unit in which an electronic component is seated and which vibrates in a second direction which is crossed with the first direction, and provides a second polarization,
    wherein a third polarization is provided on a plane on which the display panel contacts the electronic component.

2. The ultrasonic bonding apparatus of claim 1, further comprising:
    a pressurization unit disposed over the second ultrasonic generation unit.

3. The ultrasonic bonding apparatus of claim 1, wherein the third polarization is a synthesis wave of the first polarization and the second polarization.

4. The ultrasonic bonding apparatus of claim 1, wherein the third polarization has a frequency about 40 kilohertz to about 60 kilohertz.

5. The ultrasonic bonding apparatus of claim 1, wherein the first polarization and the second polarization have a prescribed phase difference.

6. The ultrasonic bonding apparatus of claim 5, wherein the third polarization is a circular polarization.

7. The ultrasonic bonding apparatus of claim 5, wherein the third polarization is an elliptical polarization.

8. The ultrasonic bonding apparatus of claim 1, wherein the first polarization and the second polarization have an identical phase.

9. The ultrasonic bonding apparatus of claim 8, wherein the third polarization is a linear polarization.

10. The ultrasonic bonding apparatus of claim 1, wherein the first polarization and the second polarization have an identical amplitude.

11. The ultrasonic bonding apparatus of claim 1, wherein the first ultrasonic generation unit and the second ultrasonic generation unit vibrate at a substantially same time.

12. An ultrasonic bonding method, the method comprising:
bringing a display panel, which is seated on a stage connected to a first ultrasonic generation unit, into contact with an electronic component seated in a second ultrasonic generation unit;
providing a first polarization vibrating in a first direction from the first ultrasonic generation unit;
providing a second polarization vibrating in a second direction, which crosses with the first direction, from the second ultrasonic generation unit; and
joining the display panel to the electronic component by a third polarization provided on a plane on which the display panel contacts the electronic component.

13. The ultrasonic bonding method of claim 12, wherein the third polarization is a synthesis wave of the first polarization and the second polarization.

14. The ultrasonic bonding method of claim 12, further comprising:
applying, by a pressurization unit disposed over the second ultrasonic generation unit, pressure in a third direction which crosses with the first direction and the second direction.

15. The ultrasonic bonding method of claim 12, where the providing the first polarization and the providing the second polarization proceed at a substantially same time.

16. The ultrasonic bonding method of claim 12, wherein the display panel comprises a plurality of signal pads, the electronic component comprises a plurality of driving bumps, and identical energy is applied to each of planes on which the plurality of signal pads contacts the plurality of driving bumps.

17. The ultrasonic bonding method of claim 12, wherein the third polarization has a frequency of about 40 kilohertz to about 60 kilohertz.

18. The ultrasonic bonding method of claim 12, wherein the third polarization is an elliptical polarization.

19. The ultrasonic bonding method of claim 12, wherein the third polarization is a linear polarization.

20. The ultrasonic bonding method of claim 12, wherein the third polarization is a circular polarization.

* * * * *